United States Patent

[11] 3,617,940

[72] Inventor John A. Copeland, III
North Plainfield, N.J.
[21] Appl. No. 564,081
[22] Filed July 11, 1966
[45] Patented Nov. 2, 1971
[73] Assignee Bell Telephone Laboratories, Incorporated
Murray Hill, N.J.

[54] LSA OSCILLATOR
9 Claims, 3 Drawing Figs.

[52] U.S. Cl. 331/107 G, 317/234 V
[51] Int. Cl. H03b 7/14
[50] Field of Search 331/107, 107 G; 317/234 (10), 235

[56] References Cited

UNITED STATES PATENTS

| | | | |
|---|---|---|---|
| 3,422,289 | 1/1969 | Atalla et al. | 331/107 X |
| 3,336,535 | 8/1967 | Mosher | 331/107 G |

OTHER REFERENCES

R. W. H. Engelmann et al, " Oscillations in Bulk GaAs Due to an Equivalent Negative RF Conductance," Proceedings of the IEEE, May 1966, pp. 786- 788. 331- 107 G W. K. Kennedy, Jr., " Power Generation in GaAs at Frequencies Far in Excess of the Intrinsic Gunn Frequency," Proceedings of the IEEE, April 1966, pp. 710. 331- 107 G A. J. Shuskus et al., " Current Instabilities in Gallium Arsenide," Proceedings of the IEEE, November 1965, pp. 1804-1805. 331- 107 G Ebersol, " LSA Promises Power at mm Waves," Microwaves, Mar. 1967, p. 10, 331- 107 G.

Kroemer, " Negative Conductance in Semiconductor," IEEE Spectrum, January 1968, pp. 51,56. 331- 107 G.

Quist et al., " S-Band GaAs Gunn Effect Oscillators," Proceedings of the IEEE, March 1965, pp. 303, 304. 331- 107 G.

Shaw et al., " Current Instability above the Gunn Threshold," Proceedings of the IEEE, November 1966, pp. 1580, 1581. 331- 107 G

*Primary Examiner*—Roy Lake
*Assistant Examiner*—Siegfried H. Grimm
*Attorneys*—R. J. Guenther and Arthur J. Torsiglieri

ABSTRACT: Under specified operating conditions a bulk semiconductor diode connected to an appropriate load through a resonant circuit will operate in a new oscillatory mode now generally designated the LSA mode (for Limited Space-Charge Accumulation). This mode is characterized by electric field excursions into the positive resistance region of the diode which are sufficient to preclude the formation of traveling electric field domains, and excursions into the negative resistance region which are sufficient to give a net gain.

INVENTOR
J. A. COPELAND III
BY
R B Anderson
ATTORNEY

LSA OSCILLATOR

This invention relates to high frequency oscillators employing semiconductive devices now generally known as bulk-effect devices or two-valley devices.

The structure and operation of bulk-effect devices are described in detail in a series of papers in the Jan., 1966 issue of the IEEE Transactions on Electron Devices, Vol. ED—13, No. 1. As is set forth in these papers, high frequency oscillations can be obtained by applying an appropriate direct current voltage across a suitable semiconductor sample of substantially homogeneous constituency; i.e., a sample that does not include any discernible PN-rectifying-junctions. These oscillations result from the formation of discrete regions of high electric field intensity and corresponding space-charge accumulation, called domains, that travel from the negative to the positive contact at approximately the carrier drift velocity. A characteristic of the bulk material is that it presents a negative differential resistance to internal currents in regions of high electric field intensity. Hence, the electric field intensity of the domain grows as it travels toward the positive electrode.

The domains are formed successively so that the oscillation frequency is approximately equal to the carrier drift velocity divided by the sample length. Since the oscillation frequency is a function of length, known bulk-effect oscillators are inherently frequency and power limited; as the sample length is reduced to give higher frequency, the attainable power decreases.

I have found that by using an external resonant circuit coupled to an appropriate bulk semiconductor diode, a new mode of operation can be attained which utilizes the entire length of the sample to give coherent oscillations, the frequency of which does not depend on sample length. Hence, by using a relatively long sample, both high frequency and efficient high power operation can be obtained.

Briefly, my device operates on the principle that the bulk negative resistance of the diode can be used to produce AC power without forming frequency-limiting traveling domains if the relevant parameters are arranged so that electric fields in the material oscillate between the positive resistance and negative resistance regions of the sample with the excursions into the negative resistance region being sufficiently short that space-charge accumulations associated with a high field domain do not have time to form. However, these time excursions into the negative resistance region are also sufficiently long, with respect to the time in which the electric field extends into the positive resistance region, to give a net gain. These criteria imply predetermined relationships between the operating frequency and the electrical characteristics of the sample in the positive and negative resistance regions, which will be described below. The frequency of the alternating fields in the sample is controlled by the external resonant circuit.

These and other features and advantages of my invention will be better appreciated from a consideration of the following detailed description, taken in conjunction with the accompanying drawing in which.

Figure 1:
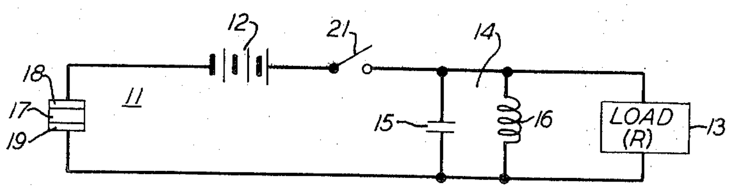
FIG. 1 is a schematic diagram of an illustrative embodiment of the invention.

Referring now to FIG. 1, there is shown an oscillator circuit arrangement in accordance with an illustrative embodiment of the invention comprising a bulk-effect diode 11, a DC voltage source 12, a load 13, and a resonant tank circuit 14 having a capacitance 15 and an inductance 16 in parallel with the load. The diode 11 comprises a sample 17 of bulk-effect semiconductor material included between substantially ohmic cathode contact 18 and an anode contact 19. The bulk-effect diode 11 can be of N-type gallium arsenide of substantially uniform constituency and doped in a manner known in the art to give a negative resistance characteristic of the type shown in FIG. 2.

The following discussion assumes that N-type material, in which operation depends primarily on electron current responses to applied voltages, is used, although it is to be understood that P-type material could alternatively be used to the extent known in the art. Further, the circuit elements shown are intended to be only schematic representations; known microwave components are preferably used to perform the functions indicated.

Figure 2:
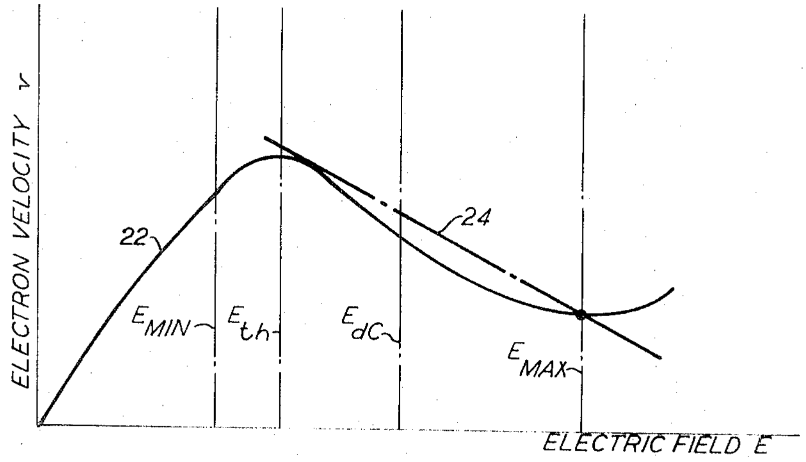
FIG. 2 is a graph of electron velocity versus electric field in the diode of the embodiment of FIG. 1.

A characteristic of bulk-effect material is that at a range of high electric field intensities, the material displays a negative differential resistance which, as shown by the graph of FIG. 2, causes the current or electron velocity in the material to decrease with increasing field. It is generally understood that in N-type GaAs this characteristic results from the presence of two energy band minima or valleys in the material separated by only a small energy gap; however, any material which exhibits this characteristic can be used.

In a conventional bulk-effect oscillator, the bulk negative differential resistance causes a region of high localized electric field intensity and space-charge accumulation to form near the cathode contact which travels at approximately the electron drift velocity toward the anode contact. The formation of a high field region, or domain, lowers the field outside of the domain until the domain reaches the anode and is extinguished. Then, a new domain is formed and the process is repeated. Hence, in a conventional bulk-effect oscillator, domains are formed successively to generate a pulsed output having a frequency $f_p$ given approximately by, $$f_p=vd/l \qquad (1)$$

where $v_d$ is the electron drift velocity, and $l$ is the length of the sample.

Figure 2A:
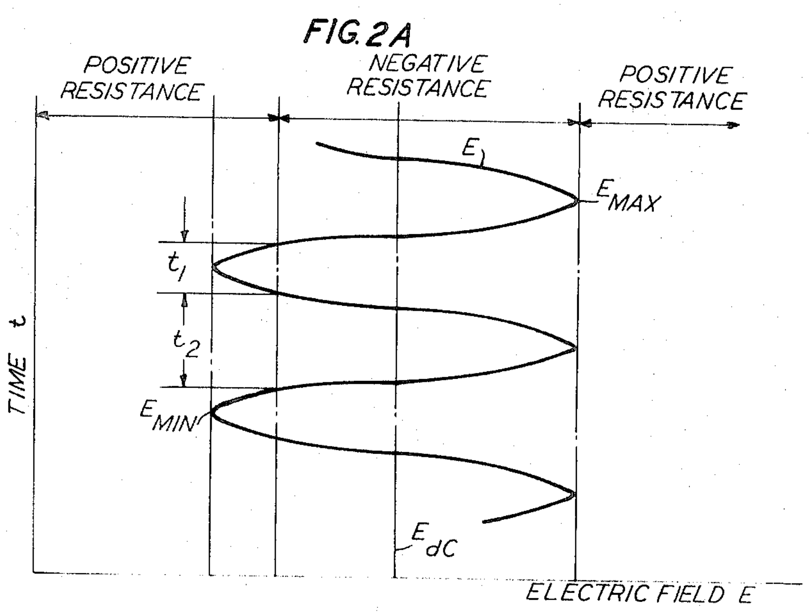
FIG. 2A is a graph of electric field versus time in the diode of the embodiment of FIG. 1.

In the apparatus of FIG. 1, however, the tank circuit 14 controls the electric field distribution in the diode 11 so as to preclude the formation of any traveling domains, while still deriving gain from the diode as required for self-sustained oscillations. With reference to the graph of FIG. 2, at electric fields between zero and the threshold field $E_{th}$, the diode 11 displays a positive differential resistance, while in a range of voltages above $E_{th}$, the material has a negative differential resistance. As is known, the differential mobility of the material is equal to the slope of characteristic 22 which in the positive resistance region has a positive value, and in the negative resistance region has a negative value. The diode is biased by source 12 at a voltage appropriate for giving a direct current electric field intensity component $E_{dc}$ which may be above or below the threshold voltage. The resonant circuit 14 and load 13 of FIG. 1 are designed, however, to produce an alternating component E in the sample that oscillates with respect to time as shown in FIG. 2A between a maximum $E_{max}$ in the negative resistance region and a minimum $E_{min}$ in the positive resistance region. The frequency of the alternating field E is substantially equal to the resonant frequency of tank circuit 14 and may be initiated by the transients resulting from closure of the switch 21 of FIG. 1 or by the higher frequency components of traveling domain oscillations. After the oscillations E are initiated they become self-sustaining due to the gain in the diode 11, and traveling domain oscillations are not generated, even if the DC bias is higher than the threshold field intensity $E_{th}$ as shown.

The amplitude and frequency of the oscillating field E is arranged so that during an interval $t_1$ of each cycle it drops below the threshold voltage into the positive resistance region, and during another interval $t_2$, it is higher than $E_{th}$ and therefore extends into the negative resistance region. During interval $t_2$ the diode delivers AC power into the tank circuit and during $t_1$ it dissipates AC power due to the positive resistance. By assuring a higher gain in energy during $t_2$ than the loss during $t_1$, a net gain is attained and the oscillations are sustained by the apparatus.

It can be shown that a net gain and a positive power output will be obtained if the following relation is satisfied, $$\frac{1}{(t_1+t_2)}\int Evdt < E_{dc}v_a \qquad (2)$$

where the integral is taken over one cycle, $E$ is the electric field, $v$ is the carrier velocity, $t$ is time, and $v_a$ is the average carrier drift velocity in the sample during oscillation which can be determined by, $$v_a=\frac{1}{(t_1+t_2)}\int v\,dt \qquad (3)$$

where the integral is taken over one cycle, $v$ depends on $E$ which in turn is determined by the DC bias field, $E_{dc}$, and the amplitude and frequency of the field oscillation.

Traveling domain oscillation is precluded by making the electric field rise from below the threshold $E_{th}$ to a high value $E_{max}$ and back below $E_{th}$ so quickly that the space-charge distribution throughout the sample associated with a high field domain does not have time to form. A space-charge accumulation layer will form due to electron injection from the cathode contact, but since the field $E$ is in the negative resistance region for less time than is necessary for space-charge growth, no appreciable depletion layer can form and the field E throughout most of the diode remains in the negative resistance region above $E_{th}$. Secondly, the time interval $t_1$ in the positive resistance region is made sufficiently long to dissipate substantially the space charge accumulation layer that forms.

In considering the problem of space charge accumulation, let $G_2$ be defined as the space-charge accumulation factor, where, $$G_2=\frac{ne}{\epsilon}\int|\mu|\,dt \qquad (4)$$

where the integral is over the time $t_2$, $\epsilon$ is the permittivity of the sample, $\mu$ is the mobility of the sample which is equal to $dv/dE$, and $e$ is the charge of an electron. $G_2$ is indicative of the space charge accumulation during time $t_2$. It can be shown that substantial accumulation of space charge will be prevented if $G_2$, and therefore $t_2$, is small enough to satisfy the relation, $$G_2<10 \qquad (5)$$

It is difficult to state with precision the limit required on space-charge accumulation in all possible embodiments of the invention to prevent domain formation. Although the factor $G_2$ of equation (5) is sufficiently small for most purposes, it may not suffice in all cases; hence, in the preferred embodiment, $G_2$ is further defined by, $$G_2<1 \qquad (6)$$

Relations (4) through (6) effectively limit the interval $t_2$ so that a domain cannot be formed during $t_2$.

In addition, it is also necessary to make $t_1$ long enough to attenuate any space-charge layers to prevent slow space-charge growth with succeeding cycles that could eventually form a domain. In considering this problem let $G_1$ be defined as the space-charge attenuation factor, where, $$G_1=\frac{ne}{\epsilon}\int|\mu|\,dt \qquad (7)$$

where the integral is over time interval $t_1$.

In order to make the space-charge attenuation greater than the space-charge growth, time interval $t_1$ during which space-charge attenuation occurs, should be long enough to satisfy the relation, $$G_1>G_2 \qquad (8)$$

An excess number of carriers are injected from the cathode contact each cycle, and it is desirable to dissipate the resulting space-charge layer before it drifts across more than a small fraction of diode. If the above restrictions are met, this will occur if the oscillation frequency $f$ of the field intensity $E$ is maintained higher than the traveling domain frequency of equation (1), or, $$f>l/'d\ v \qquad (9)$$

In the preferred embodiment it is further desirable that $$G_1>5 \qquad (10)$$

to give dissipation of space-charge accumulation in one cycle, rather than progressive attenuation over several cycles. Relationship (6) prevents any space-charge accumulation from forming into a domain, while relation (10) assures dissipation of any space-charge layer formed during the interval $t_2$ so that an accumulation cannot slowly intensify with succeeding cycles of operation.

Relationships (5), (8), and (10) obviously impose certain restrictions on the external circuit. The characteristic frequency of the resonant circuit 14 should be arranged with respect to the applied DC electric field $E_{dc}$ to give the time intervals $t_1$ and $t_2$ required for proper values of $G_1$ and $G_2$. While the optimum bias field $E_{dc}$ depends on the characteristics of the particular diode used, it is recommended that for gallium arsenide it be equal to or more than 1.5 times the threshold field $E_{th}$. For a given material, relations (4) and (7) will lead to a ratio of doping level to frequency which is optimum for this new mode and for gallium arsenide a ratio of $10^5$ sec./cm.$^3$ is suggested. In order that the oscillating field $E$ extend into the positive resistance region, and that it rise sharply into the negative resistance region, the circuit should be "lightly loaded"; i.e., the effective parallel load resistance R should be fairly high. For a gallium arsenide diode, it is therefore preferable that the load resistance R conform to the relationship, $$R>\frac{l}{n_0|\mu_2|eA} \qquad (11)$$

where $l$ is the length of the sample, $n_o$ is the doping level or average carrier concentration, $\mu_2$ is the average mobility in the negative resistance range, and $A$ is the area of the sample taken along a plane parallel to the contacts. The figure of merit q of the external circuit preferably conforms to the relationship, $$Q=\frac{R}{2\pi fL}>5 \qquad (12)$$

where $f$ is the characteristic frequency of the circuit and $L$ is the inductance of inductor 16.

A circuit of the type described using an N-type gallium arsenide sample has been built for obtaining an output power of 10 milliwatts at 30 kilomegacycles per second ($3\times10^{10}$ c.p.s.). The circuit had the following parameters: doping level $n$ was approximately $3\times10^{15}$ carrier units per cubic centimeter; cross-sectional area of the sample was 3×10'5 square centimeter; sample length $l$ was 1.0×10'3 centimeter; bias voltage $E_{dc}$ was 18 volts; resistance $R$ was approximately 300 ohms; and the figure of merit $Q$ was approximately 100.

From the foregoing, it can be appreciated that my invention is based on the discovery of a new mode of oscillation that can be excited in bulk-effect diodes. Because the sample length does not determine the output frequency and because most of the sample is active, high frequency power can be efficiently obtained by using the relatively longer sample required for high-power operation in circuits which have a practical limitation on the minimum impedance of components.

The embodiment shown is intended only to be illustrative of the principles of the invention. For example, the electric field maximum $E_{max}$ of FIG. 2A may extend beyond the negative resistance region into the positive resistance region. In this case the integrated time $t_1$ used for determining the space charge attenuation factor $G_1$ would include the interval in the high field positive resistance region. Various other modifications and embodiments may be made by those skilled in the art without departing from the spirit and scope of the invention.

What is claimed is:

1. A circuit arrangement comprising:

a bulk-effect semiconductor diode comprising a sample of bulk semiconductor material having substantially ohmic contacts on opposite ends thereof;

said sample having a product of doping density $n$ and length $l$ which is at least twice the minimum value required for permitting the formation of traveling domains;

means for producing within the diode an electric field that alternates between positive and negative differential resistance regions;

the time interval $t_1$ of each cycle of alternation at which the electric field is within a positive differential resistance region conforming substantially to the relation $G_1>1$ where $$G_1=\frac{ne}{\epsilon}\int\left|\frac{dv}{dE}\right|dt$$

where the integral is taken over the interval $t_1$, $\epsilon$ is the permittivity of the sample, $v$ is the carrier velocity in the diode, $E$ is the electric field in the diode, and $e$ is the charge of an electron;

the time interval $t_2$ of each cycle of alternation at which the electric field is within the negative differential resistance region conforming substantially to the relation $G_2<G_1$ where $$G_2=\frac{ne}{\epsilon}\int\left|\frac{dv}{dE}\right|dt$$

where the integral is taken over the interval $t_2$;

the time interval $t_2$ also substantially conforming to the relationship $$\frac{1}{(t_1+t_2)}\int Evdt<E_{dc}v_a$$

where the integral is taken over one cycle, $E$ is the electric field intensity in the diode, $v$ is the velocity of current carriers in the diode, $E_{dc}$ is the average electric field intensity, and $v_a$ is the average current carrier velocity, whereby the ratio of $t_2$ to $t_1$ is sufficiently large to provide a net gain to the alternating electric field, but sufficiently small to prevent the formation of traveling domain oscillations in the diode.

2. The arrangement of claim 1 wherein:

the intervals $t_1$ and $t_2$ also substantially conform to the relationship 2

$G_1>5$ and the frequency also substantially conforms to the relationship $f>v_a/l$ where $l$ is the sample length.

3. The circuit arrangement of claim 1 further comprising:

a direct current voltage source connected to the diode;

a resonant circuit connected in parallel with the diode;

and a resistive load coupled in parallel with the diode and the resonant circuit;

The characteristic frequency of the resonant circuit being substantially equal to the frequency of electric field alternations in the diode.

4. The circuit arrangement of claim 3 wherein:

the figure of merit of the resonant circuit and the load resistance is greater than 5;

and the resistance $R$ of the load substantially conforms to the relationship $$R>\frac{l}{n\,|\mu_2|\,eA}$$

where $l$ is the length of the bulk semiconductor sample, $n$ is the doping level, and $A$ is the area of the sample.

5. The circuit arrangement of claim 1 wherein:

the sample is doped gallium arsenide;

and the ratio of doping level to frequency is approximately $10^5$ sec./cm.$^3$.

6. A circuit arrangement comprising:

a bulk-effect semiconductor diode of the type which is capable of forming and supporting traveling electric field domains under suitable bias conditions;

the product of the carrier concentration n and wafer length $l$ of the semiconductor diode being at least twice the minimum value required for permitting the formation of said traveling domains;

said diode being further characterized by a positive differential resistance when subjected to electric fields within a first range and a negative differential resistance when subjected to electric fields within a second range;

means for producing within the diode an electric field that alternates between the first and second ranges, whereby during a positive resistance portion of each cycle of alternation the electric field is in the first range and during a negative resistance portion of each cycle of alternation the electric field is in the second range;

the ratio of the negative resistance portion of each cycle to the positive resistance portion being sufficiently large to assure a net gain to the alternating electric field, but sufficiently small to prevent the formation of traveling domain oscillations in the diode.

7. In the circuit arrangement of claim 6 wherein:

the alternating electric field producing means comprises a DC voltage source and a resonant circuit connected to the diode;

the frequency of electric field alternations in the diode being substantially equal to the characteristic frequency of the resonant circuit.

8. The circuit arrangement of claim 7 wherein:

the diode is characterized by an inherent traveling domain frequency which is substantially equal to the sample length divided by the average current carrier drift velocity;

and the characteristic frequency of the resonant circuit is higher than said inherent traveling domain frequency.

9. A circuit arrangement comprising:

a bulk-effect semiconductor diode comprising a sample of bulk semiconductor material having a pair of substantially ohmic connections spaced apart along the sample;

said diode being characterized by a negative resistance when subjected to voltages within a voltage range above a predetermined threshold voltage, an inherent traveling domain frequency when subjected to only a direct current voltage which is within said voltage range, and a product of carrier concentration n and wafer length $l$ at least twice the minimum value required for permitting the formation of traveling domains;

means comprising a direct current voltage source, a resonant circuit and a load connected to said ohmic contacts for establishing self-sustaining high frequency oscillations within said sample;

said voltage source establishing a direct current voltage component in the sample that is within said voltage range;

said resonant circuit being resonant at a higher frequency than said inherent traveling domain frequency;

and means comprising said resonant circuit and said load for prohibiting the formation of traveling domain oscillations within said sample.

* * * * *